United States Patent
Jones

(10) Patent No.: US 6,853,838 B2
(45) Date of Patent: Feb. 8, 2005

(54) BIASING CIRCUIT FOR DEGENERATED DIFFERENTIAL PAIR

(75) Inventor: Mark Alan Jones, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 616 days.

(21) Appl. No.: 09/854,737

(22) Filed: May 14, 2001

(65) Prior Publication Data

US 2002/0168954 A1 Nov. 14, 2002

(51) Int. Cl.[7] .................................................. H04B 1/06
(52) U.S. Cl. ................. 455/234.1; 455/116; 455/241.1; 330/252; 331/75
(58) Field of Search ........................... 455/234.1, 214.1, 455/116, 232.1, 258, 318, 321; 330/252, 254, 261, 306; 331/75, 175, 127

(56) References Cited

U.S. PATENT DOCUMENTS

| | | | | |
|---|---|---|---|---|
| 4,267,516 A | * | 5/1981 | Traa | 330/252 |
| 4,381,487 A | * | 4/1983 | Erickson | 330/306 |
| 4,602,224 A | * | 7/1986 | Arimoto et al. | 332/135 |
| 4,825,173 A | * | 4/1989 | Cornett | 330/254 |
| 5,867,778 A | * | 2/1999 | Khoury et al. | 455/321 |
| 5,874,865 A | * | 2/1999 | Fairgrieve | 331/75 |
| 6,066,991 A | * | 5/2000 | Naito et al. | 331/75 |
| 6,642,787 B1 | * | 11/2003 | Souetinov et al. | 330/252 |
| 6,731,693 B1 | * | 5/2004 | Damgaard | 331/127 |

* cited by examiner

Primary Examiner—Edward F. Urban
Assistant Examiner—Lana Le

(57) ABSTRACT

An improved single-ended input differential pair amplifier stage comprises: 1) a first p-n-p transistor having a base terminal coupled to an input voltage; 2) a first load impedance having a first terminal coupled to a ground reference and a second terminal coupled to a collector of the first p-n-p transistor; 3) a second p-n-p transistor having a base terminal coupled to the ground reference; 4) a second load impedance having a first terminal coupled to a ground reference and a second terminal coupled to a collector of the second p-n-p transistor; 5) an inductor having a first terminal coupled to an emitter of the first p-n-p transistor and a second terminal coupled to an emitter of the second p-n-p transistor; and 6) a constant current source coupled to the emitter of the second p-n-p transistor.

12 Claims, 3 Drawing Sheets

BIASING CIRCUIT FOR DEGENERATED DIFFERENTIAL PAIR

TECHNICAL FIELD OF THE INVENTION

The present invention is generally directed to radio frequency (RF) transceivers and, in particular, to an improved degenerated differential pair for use in amplifiers or mixers in the transmit and receive paths of a RF transceiver.

BACKGROUND OF THE INVENTION

The power consumption, speed, noise, and distortion characteristics of radio frequency (RF) transceivers are significantly affected by the performance of the RF power amplifiers and mixers used in the transmit signal path and the receive signal path. If an amplifier or mixer has good (or high) linearity, the amount of signal distortion introduced by amplification is minimized and relatively high signal quality may be attained. However, in order to maintain high linearity, an amplifier or mixer must be operated at power supply currents levels that are much higher that the average peak-to-peak signal current. This greatly increases the power consumption of the RF amplifier or mixer, resulting in a tradeoff between linear performance and power consumption.

A very common stage in RF amplifiers is the differential pair stage. FIG. 3 illustrates conventional differential pair amplifier stage 300 according to one embodiment of the prior art. Amplifier stage 300 comprises bias current transistor 305, transistors 310 and 315, resistors 320 and 325, coupling capacitors 330 and 335, and inductors 340 and 345. Transistors 305, 310, and 315 are n-p-n transistors. For the sake of simplicity in explaining the operation of the amplifier stage, DC biasing circuits are omitted from FIG. 3.

The illustrated configuration is know as a degenerated differential pair. Inductors 340 and 345 degenerate (reduce) the gain at $V_{OUT}$ of amplifier stage 300, but introduce negative feedback is in the emitters of transistors 310 and 315, thereby giving a more linear response. Amplifier stage 300 is a single-ended input because the input signal $V_{IN}$ is applied only to one input of the stage (i.e., coupling capacitor 330). The other input is grounded. The bias voltage, $V_{bias}$, establishes a bias current, $I_{bias}$, in transistor 305. $I_{bias}$ is split between the two branches of amplifier stage 300. If $V_{IN}$ is zero, one half of $I_{bias}$, flows through the first branch, which comprises transistor 310 and resistor 320. The one half of $I_{bias}$ flows through the second branch, which comprises transistor 315 and resistor 325.

When a differential amplifier with emitter (or source) degeneration is driven from a single-ended input source, the time-varying voltage at $V_a$, roughly equal to one half of $V_{IN}$, can produce unwanted modulation of the value of the tail current. The signal at $V_a$ leads to a reduction of the circuit linearity, an important parameter of RF transceiver designs.

Therefore, there is a need in the art for improved amplifiers and mixers for use in RF transceivers. In particular, there is a need for a degenerated differential pair amplifier stage that does not reduce linearity due to unwanted modulation in the value of the tail current.

SUMMARY OF THE INVENTION

To address the deficiencies of the prior art, it is a primary object of the present invention to provide an improved single-ended differential pair amplifier stage. According to a first advantageous embodiment of the present invention, the single-ended differential pair amplifier stage comprises: 1) a first p-n-p transistor having a base terminal coupled to an input voltage; 2) a first load impedance having a first terminal coupled to a ground reference and a second terminal coupled to a collector of the first p-n-p transistor; 3) a second p-n-p transistor having a base terminal coupled to the ground reference; 4) a second load impedance having a first terminal coupled to a ground reference and a second terminal coupled to a collector of the second p-n-p transistor; 5) an inductor having a first terminal coupled to an emitter of the first p-n-p transistor and a second terminal coupled to an emitter of the second p-n-p transistor; and 6) a constant current source coupled to the emitter of the second p-n-p transistor.

According to one embodiment of the present invention, the constant current source is a third p-n-p transistor having a collector coupled to the emitter of the second p-n-p transmitter and an emitter coupled to a power supply voltage.

According to a fourth advantageous embodiment of the present invention, the single-ended differential pair amplifier stage comprises: 1) a first p-type field effect transistor having a gate terminal coupled to an input voltage; 2) a first load impedance having a first terminal coupled to a ground reference and a second terminal coupled to a drain of the first p-type field effect transistor; 3) a second p-type field effect transistor having a gate terminal coupled to the ground reference; 4) a second load impedance having a first terminal coupled to the ground reference and a second terminal coupled to a drain of the second p-type field effect transistor; 5) an inductor having a first terminal coupled to a source of the first p-type field effect transistor and a second terminal coupled to a source of the second p-type field effect transistor; and 6) a constant current source coupled to the source of the second p-type field effect transistor.

According to one embodiment of the present invention, the constant current source is a third p-type field effect transistor having a drain coupled to the source of the second p-type field effect transistor and a source coupled to a power supply.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one is operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged amplifier.

Figure 1:
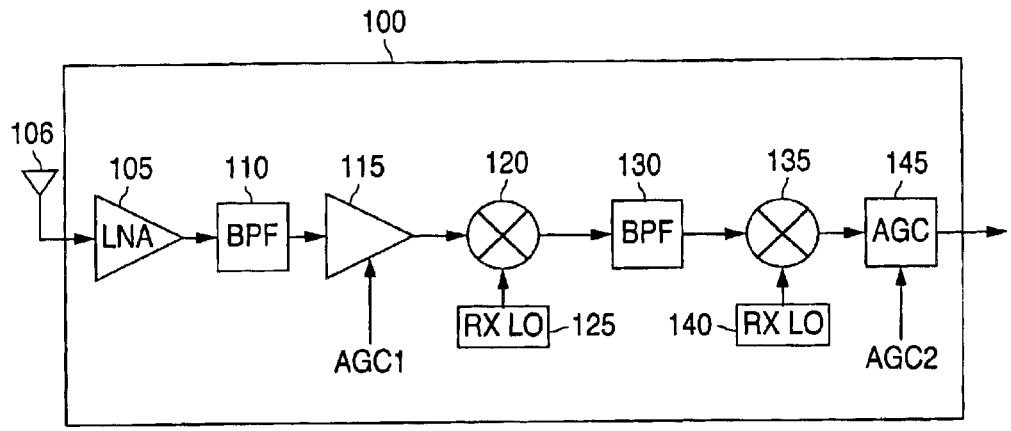
FIG. 1 illustrates selected portions of the receive signal path of an exemplary radio frequency (RF) transceiver according to one embodiment of the present invention.

FIG. 1 illustrates selected portions of the receive signal path of exemplary radio frequency (RF) transceiver 100 according to one embodiment of the present invention. RF transceiver 100 may represent any conventional RF communication device, including a cell phone, a wireless network card, a two-way pager, and the like. The RF receive path through RF transceiver 100 comprises low-noise amplifier (LNA) 105, which receives an incoming RF signal from antenna 106. The RF receive path further comprises band pass filter (BPF) 110, RF amplifier 115, RF mixer 120, local oscillator (LO) 125, band pass filter (BPF) 110, intermediate frequency (IF) mixer 135, local oscillator (LO) 140, and automatic gain control (AGC) circuit 145.

LNA 105 amplifies the incoming RF signal from antenna 106 to an intermediate level. BPF 110 filters the output of LNA 105 to remove noise outside of the desired receiver frequency range. RF amplifier 115 further amplifies the output of BPF 110 by a variable amount of gain determined by the gain control signal AGC1. RF mixer 115 down-converts the output of RF amplifier 115 by mixing it with the local oscillator reference signal from LO 125 to produce an intermediate frequency (IF) signal. RF mixer 115 effectively shifts the RF signal centered around the receiver RF operating frequency down to an intermediate frequency (IF) signal.

At this point, the signal output by RF mixer 115 may have spurious signals outside of the desired frequency range which have been amplified and/or introduced by the amplification steps. BPF 130 is an extremely narrow filter that blocks all but the desired frequencies of interest from reaching IF mixer 135. IF mixer 135 down-converts the IF output of BPF 130 by mixing it with the local oscillator reference signal from LO 140 to produce a baseband signal. AGC circuit 145 further amplifies the output of IF mixer 145 by a variable amount of gain determined by the gain control signal AGC2.

Figure 2:
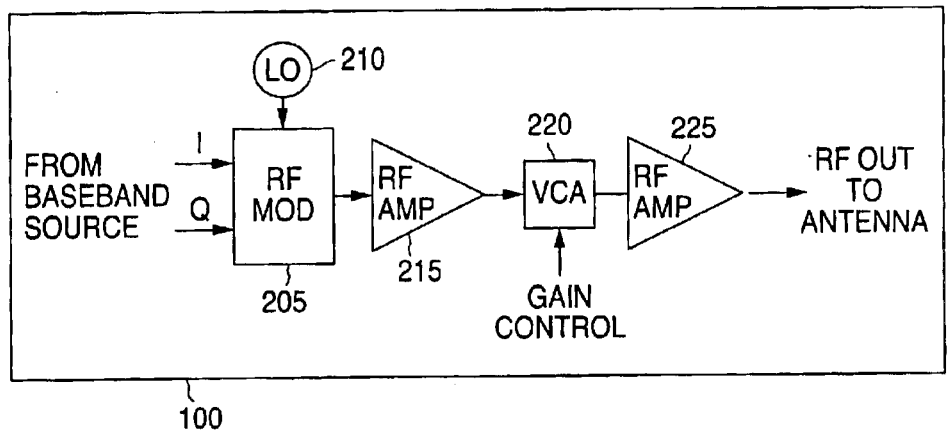
FIG. 2 illustrates selected portions of the transmit signal path of an exemplary RF transceiver according to one embodiment of the present invention.
Figure 3:
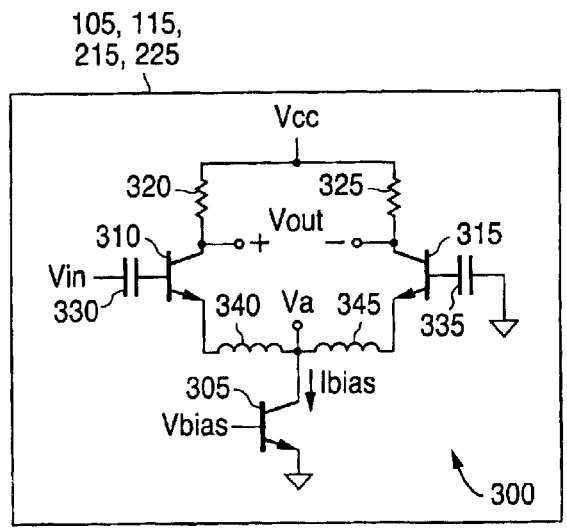
FIG. 3 illustrates a conventional single-ended differential pair amplifier stage according to one embodiment of the prior art.

FIG. 2 illustrates selected portions of the transmit signal path of exemplary RF transceiver 100 according to one embodiment of the present invention. The transmit path comprises radio frequency (RF) modulator 205, local oscillator (LO) 210, RF amplifier 215, voltage-controlled attenuator (VCA) 220, and RF amplifier 225. RF modulator 205 receives a baseband in-phase (I) signal and a baseband quadrature (Q) signal from a baseband source and a quadrature source mixes them with a reference carrier signal received from LO 210 to produce an RF output signal. The RF output signal is then amplified by RF amplifier 215 to an intermediate level in the range of VCA 220. VCA attenuates the amplified RF output from RF amplifier 215 and the attenuated RF output of VCA 220 is amplified by RF amplifier 225 to a level suitable for transmission by antenna 106. The attenuation factor applied by VCA 220 is controlled by the value of the GAIN CONTROL signal.

The transmit and receive paths of transceiver 100 comprise a number of RF amplifiers. These RF amplifiers may comprise a number of sequential amplifier stages that boost the power of an RF input is signal in successive steps. These amplifier stages may include one or more single-ended input differential pair amplifier stages according to the principles of the present invention.

Figure 4:
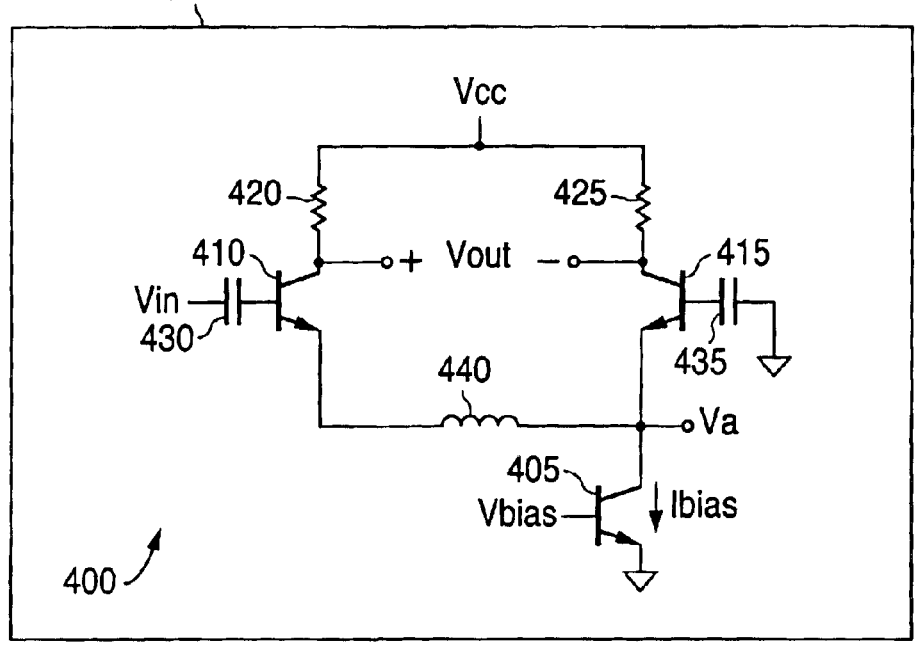
FIG. 4 illustrates an exemplary single-ended differential pair amplifier stage according to a first embodiment of the present invention.

FIG. 4 illustrates exemplary single-ended differential pair amplifier stage 400 according to a first embodiment of the present invention. Amplifier stage 400 comprises bias current transistor 405, transistors 410 and 415, resistors 420 and 425, coupling capacitors 430 and 435, and inductor 440. Transistors 405, 410, and 415 are n-p-n transistors. Optionally, the emitter of transistor 405 may be indirectly coupled to ground through a resistor. For the sake of simplicity in explaining the operation of amplifier stage 400, DC biasing circuits are omitted from FIG. 4.

The illustrated configuration in FIG. 4 is a modified version of a degenerated differential pair according to the principles of the present invention. Inductors 340 and 345 from the prior art design are combined into a single inductor, namely inductor 440, of equal value and with no loss of generality. Inductor 440 degenerates the gain at $V_{OUT}$ of amplifier stage 400, but introduces negative feedback in the emitters of transistors 410 and 415.

However, the tail current (or bias current) is connected to the emitter of the non-input device, namely transistor 415. This greatly reduces the voltage fluctuations on the tail current because $V_a$ is now limited to the minor changes in the diode voltage, $V_{be}$, below ground. This greatly reduces the modulation effects of $V_a$, thereby increasing linearity.

Figure 5:
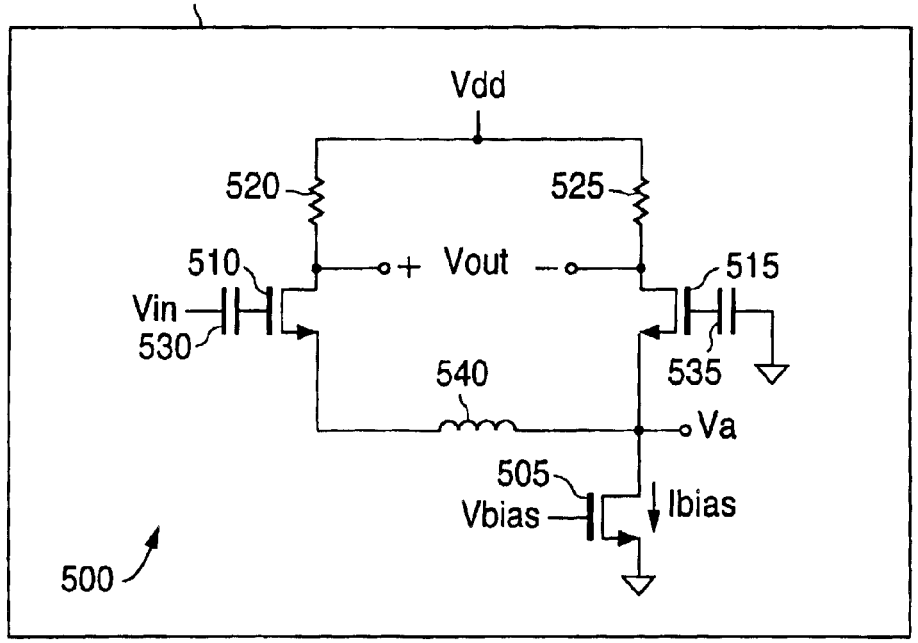
FIG. 5 illustrates an exemplary single-ended differential pair amplifier stage according to a second embodiment of the present invention.

Amplifier stage 400 may be implemented using transistors other than n-p-n transistors. FIG. 5 illustrates exemplary single-ended input differential pair amplifier stage 500 according to a second embodiment of the present invention. Amplifier stage 500 comprises bias current transistor 505, transistors 510 and 515, resistors 520 and 525, coupling capacitors 530 and 535, and inductor 540. Amplifier stage 500 is nearly identical to amplifier stage 400, except that transistors 505, 510, and 515 are N-type MOSFET transistors. The sources of transistors 510 and 515 are coupled to inductor 540. As in the case of FIG. 4, DC biasing circuits are omitted from FIG. 4.

Figure 6:
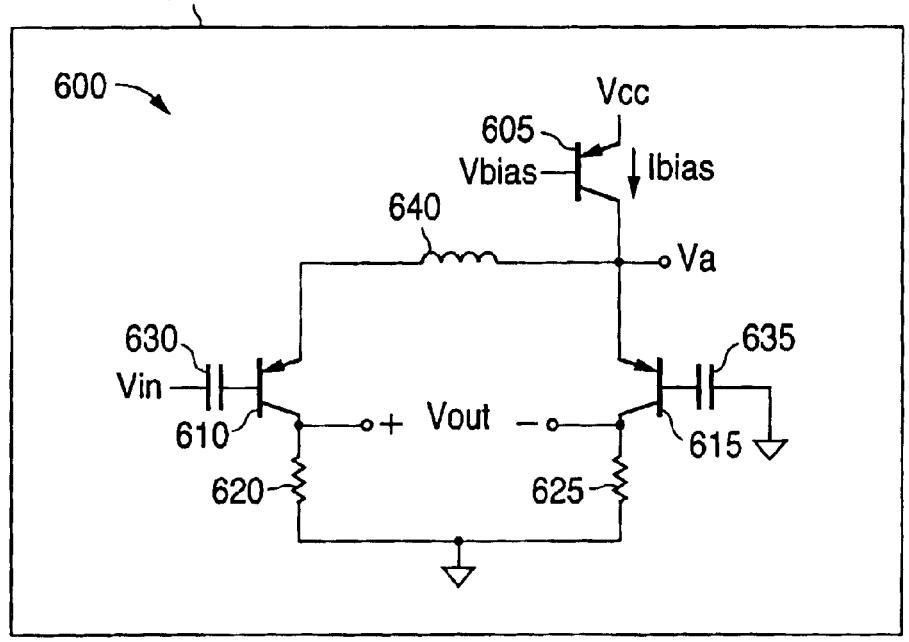
FIG. 6 illustrates an exemplary single-ended differential pair amplifier stage according to a third embodiment of the present invention.

FIG. 6 illustrates exemplary single-ended differential pair amplifier stage 600 according to a third embodiment of the present invention. Amplifier stage 600 comprises bias current transistor 605, transistors 610 and 615, resistors 620 and 625, coupling capacitors 630 and 635, and inductor 640. In this embodiment, transistors 605, 610, and 615 are p-n-p transistors. The emitters of transistors 610 and 615 are coupled to inductor 640.

Figure 7:
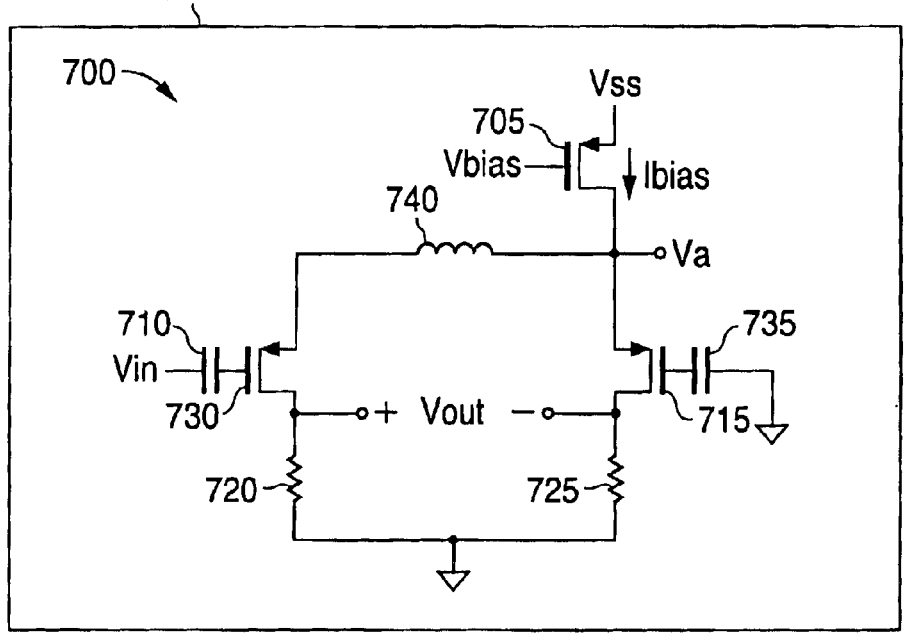
FIG. 7 illustrates an exemplary single-ended differential pair amplifier stage according to a fourth embodiment of the present invention.

Finally, FIG. 7 illustrates exemplary single-ended differential pair amplifier stage 700 according to a fourth embodiment of the present invention. Amplifier stage 700 comprises bias current transistor 705, transistors 710 and 715, resistors 720 and 725, coupling capacitors 730 and 735, and inductor 740. Amplifier stage 700 is nearly identical to amplifier stage 600, except that transistors 705, 710, and 715 are P-type MOSFET transistors. The sources of transistors 710 and 715 are coupled to inductor 740. As in the case of FIG. 6, DC biasing circuits are omitted from FIG. 7.

In FIG. 4-7, resistors were used as impedance loads only for the purpose of illustration. Those skilled in the art with readily understand that other impedance loads may be substituted for one or more of the exemplary resistors in FIGS. 4–7 above. In particular, inductors or active loads may be substituted for one or more of the exemplary resistors in FIGS. 4–7.

Although the present invention has been described in detail, those skilled in the art should understand that they can make various changes, substitutions and alterations herein without departing from the spirit and scope of the invention in its broadest form.

What is claimed is:

1. A single-ended input differential pair amplifier stage comprising:
   a first p-n-p transistor having a base terminal coupled to an input voltage;
   a first load impedance having a first terminal coupled to a ground reference and a second terminal coupled to a collector of said first p-n-p transistor;
   a second p-n-p transistor having a base terminal coupled to said ground reference;
   a second load impedance having a first terminal coupled to said power supply and a second terminal coupled to a collector of said second p-n-p transistor;
   an inductor having a first terminal coupled to an emitter of said first p-n-p transistor and a second terminal coupled to an emitter of said second p-n-p transistor; and
   a constant current source coupled to said emitter of said second p-n-p transistor.

2. The single-ended input differential pair amplifier stage as set forth in claim 1 wherein said constant current source is a third p-n-p transistor having a collector coupled to said emitter of said second p-n-p transmitter and an emitter coupled to a power supply voltage.

3. A single-ended input differential pair amplifier stage comprising:
   a first p-type field effect transistor having a gate terminal coupled to an input voltage;
   a first load impedance having a first terminal coupled to a ground reference and a second terminal coupled to a drain of said first p-type field effect transistor;
   a second p-type field effect transistor having a gate terminal coupled to said ground reference;
   a second load impedance having a first terminal coupled to said ground reference and a second terminal coupled to a drain of said second p-type field effect transistor;
   an inductor having a first terminal coupled to a source of said first p-type field effect transistor and a second terminal coupled to a source of said second p-type field effect transistor; and
   a constant current source coupled to said source of said second p-type field effect transistor.

4. The single-ended input differential pair amplifier stage as set forth in claim 3 wherein said constant current source is a third p-type field effect transistor having a drain coupled to said source of said second p-type field effect transistor and a source coupled to a power supply.

5. A radio frequency (RF) receiver comprising:
   a receiver front-end circuit capable of receiving an incoming RF signal from an antenna and generating an amplified RF output signal, said receiver front-end circuit containing at least one RF amplifier comprising:
     a first p-n-p transistor having a base terminal coupled to an input voltage;
     a first load impedance having a first terminal coupled to a ground reference and a second terminal coupled to a collector of said first p-n-p transistor;
     a second p-n-p transistor having a base terminal coupled to said ground reference;
     a second load impedance having a first terminal coupled to said power supply and a second terminal coupled to a collector of said second p-n-p transistor;
     an inductor having a first terminal coupled to an emitter of said first p-n-p transistor and a second terminal coupled to an emitter of said second p-n-p transistor; and
     a constant current source coupled to said emitter of said second p-n-p transistor; and
   demodulation circuitry coupled to said receiver front-end circuitry capable of demodulating said amplified RF output signal.

6. The RF receiver as set forth in claim 5 wherein said constant current source is a third p-n-p transistor having a collector coupled to said emitter of said second p-n-p transmitter and an emitter coupled to a power supply voltage.

7. A radio frequency (RF) receiver comprising:
   a receiver front-end circuit capable of receiving an incoming RF signal from an antenna and generating an amplified RF output signal, said receiver front-end circuit containing at least one RF amplifier comprising:
     a first p-type field effect transistor having a gate terminal coupled to an input voltage;
     a first load impedance having a first terminal coupled to a ground reference and a second terminal coupled to a drain of said first p-type field effect transistor;
     a second p-type field effect transistor having a gate terminal coupled to said ground reference;
     a second load impedance having a first terminal coupled to said ground reference and a second terminal coupled to a drain of said second p-type field effect transistor;

an inductor having a first terminal coupled to a source of said first p-type field effect transistor and a second terminal coupled to a source of said second p-type field effect transistor; and a constant current source coupled to said source of said second p-type field effect transistor; and demodulation circuitry coupled to said receiver front-end circuitry capable of demodulating said amplified RF output signal.

8. The RF receiver as set forth in claim 7 wherein said constant current source is a third p-type field effect transistor having a drain coupled to said source of said second p-type field effect transistor and a source coupled to a power supply.

9. A radio frequency (RF) transmitter comprising:

a RF modulation circuit capable of receiving an incoming baseband signal and up-converting said incoming baseband signal to produce a modulated RF signal; and at least one RF amplifier capable of amplifying said modulated RF signal, said RF amplifier comprising:

a first p-n-p transistor having a base terminal coupled to an input voltage;

a first load impedance having a first terminal coupled to a ground reference and a second terminal coupled to a collector of said first p-n-p transistor;

a second p-n-p transistor having a base terminal coupled to said ground reference;

a second load impedance having a first terminal coupled to said power supply and a second terminal coupled to a collector of said second p-n-p transistor;

an inductor having a first terminal coupled to an emitter of said first p-n-p transistor and a second terminal coupled to an emitter of said second p-n-p transistor; and a constant current source coupled to said emitter of said second p-n-p transistor.

10. The RF transmitter as set forth in claim 9 wherein said constant current source is a third p-n-p transistor having a collector coupled to said emitter of said second p-n-p transistor and an emitter coupled to a power supply voltage.

11. A radio frequency (RF) transmitter comprising:

a RF modulation circuit capable of receiving an incoming baseband signal and up-converting said incoming baseband signal to produce a modulated RF signal; and at least one RF amplifier capable of amplifying said modulated RF signal, said RF amplifier comprising:

a first p-type field effect transistor having a gate terminal coupled to an input voltage;

a first load impedance having a first terminal coupled to a ground reference and a second terminal coupled to a drain of said first p-type field effect transistor;

a second p-type field effect transistor having a gate terminal coupled to said ground reference;

a second load impedance having a first terminal coupled to said ground reference and a second terminal coupled to a drain of said second p-type field effect transistor;

an inductor having a first terminal coupled to a source of said first p-type field effect transistor and a second terminal coupled to a source of said second p-type field effect transistor; and a constant current source coupled to said source of said second p-type field effect transistor.

12. The RF transmitter as set forth in claim 11 wherein said constant current source is a third p-type field effect transistor having a drain coupled to said source of said second p-type field effect transistor and a source coupled to a power supply.

* * * * *